(12) United States Patent
Baek

(10) Patent No.: US 7,847,594 B2
(45) Date of Patent: Dec. 7, 2010

(54) DATA OUTPUT CIRCUIT OF A SEMICONDUCTOR INTEGRATED CIRCUIT

(75) Inventor: Chang-Ki Baek, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/341,938

(22) Filed: Dec. 22, 2008

(65) Prior Publication Data

US 2010/0033210 A1 Feb. 11, 2010

(30) Foreign Application Priority Data

Aug. 8, 2008 (KR) .................. 10-2008-0077708

(51) Int. Cl.
*H03K 19/094* (2006.01)
(52) U.S. Cl. .................. 326/83; 326/87; 327/108
(58) Field of Classification Search .......... 326/30, 326/83, 86, 87; 327/108–112
See application file for complete search history.

(56) References Cited

U.S. PATENT DOCUMENTS

| | | | |
|---|---|---|---|
| 5,003,205 A * | 3/1991 | Kohda et al. ........... | 326/81 |
| 5,959,474 A * | 9/1999 | Park et al. ............ | 327/112 |
| 6,714,461 B2 | 3/2004 | Matsumoto et al. | |
| 6,744,298 B2 | 6/2004 | Yamauchi et al. | |
| 2003/0071663 A1 * | 4/2003 | Taguchi et al. ......... | 327/112 |
| 2006/0170455 A1 * | 8/2006 | Torres et al. ........... | 326/83 |

FOREIGN PATENT DOCUMENTS

| | | |
|---|---|---|
| JP | 05037345 | 2/1993 |
| JP | 2003-283322 | 10/2003 |
| KR | 1019970055518 | 12/1995 |

* cited by examiner

*Primary Examiner*—Rexford N Barnie
*Assistant Examiner*—Jany Tran
(74) *Attorney, Agent, or Firm*—Baker & McKenzie LLP

(57) ABSTRACT

A data output circuit of a semiconductor integrated circuit includes a plurality of drivers configured to drive data output terminals to a logic level corresponding to levels of input data in response to driving control signals, and a control section configured to activate and output driving control signals that supplied to a first group of the plurality of drivers, and to activate or inactivate and output driving control signals that supplied to a second group of the plurality of drivers, depending upon a level of a supply voltage.

5 Claims, 4 Drawing Sheets

DATA OUTPUT CIRCUIT OF A SEMICONDUCTOR INTEGRATED CIRCUIT

CROSS-REFERENCES TO RELATED APPLICATION

The present application claims priority under 35 U.S.C. §119(a) to Korean application number 10-2008-0077708, filed on Aug. 8, 2008, in the Korean Intellectual Property Office, which is incorporated herein by reference in its entirety as set forth in full.

BACKGROUND

1. Technical Field

The embodiments described herein relate to a data output circuit, and more particularly, to a data output circuit of a semiconductor integrated circuit driven using different supply voltages.

2. Related Art

FIG. 1 is a schematic block diagram of a conventional data output circuit. In FIG. 1, a data output circuit 1 includes a control section 10 and a data driving section 20. The control section 10 is configured to generate driving signals 'PU' and 'PD' in response to the level of input data 'DATA_IN'. The data driving section 20 has a driver group that includes a plurality of drivers operated in response to the driving signals 'PU' and 'PD' and drive output data 'DATA_OUT' to the logic level of the input data 'DATA_IN'.

The standards for semiconductor memories include those for the output impedance of a data output circuit. Hence, a data output circuit must be designed to satisfy the standards for output impedance. The output impedance of a data output circuit is determined by the driving strength of a driver group, which can be adjusted by increasing or decreasing the number of the drivers included in the driver group.

In the conventional data output circuit, when a preset level of supply voltage (VDDQ), for example, 1.8V of supply voltage (VDDQ) is used, the driver group is designed such that output impedance can satisfy the standards.

In semiconductor memory devices, as power efficiencies increase, a supply voltage (VDDQ) gradually decreases. Accordingly, the output impedance of semiconductor memories must satisfy the standards not only when 1.8V of supply voltage (VDDQ) is used but also when 1.2V of supply voltage (VDDQ) is used. However, in the conventional data output circuit, since the driver group is designed to conform to 1.8V of supply voltage (VDDQ), if 1.2V of supply voltage (VDDQ) is used, output impedance cannot have a value satisfying the standards, which causes a problem.

Of course, it is possible to use two data output circuits, which are respectively designed for different supply voltages, that is, 1.8V and 1.2V of supply voltages (VDDQ). Nevertheless, in this case, circuit area increases due to the configuration of the two data output circuits, and since the two data output circuits are commonly connected to data output pins (DQ), pin capacitance is likely to increase.

SUMMARY

A data output circuit of a semiconductor integrated circuit that can maintain output impedance to a value satisfying standards for supply voltages having different levels is described herein.

In one aspect, a data output circuit of a semiconductor integrated circuit includes a plurality of drivers configured to drive data output terminals to a logic level corresponding to levels of input data in response to driving control signals, and a control section configured to activate and output driving control signals that supplied to a first group of the plurality of drivers, and to activate or inactivate and output driving control signals that supplied to a second group of the plurality of drivers, depending upon a level of a supply voltage.

In another aspect, a data output circuit of a semiconductor integrated circuit includes a first driver group configured to drive data output terminals to a logic level corresponding to input data, a second driver group configured to drive the data output terminals to a logic level corresponding to the input data, and a control section configured to operate the second driver group depending upon a level of a supply voltage.

In another aspect, a data output circuit of a semiconductor integrated circuit includes a first control section configured to generate first driving control signals corresponding to input data, a second control section configured to generate second driving control signals corresponding to the input data, depending upon a level of a supply voltage, and a data driving section configured to drive data output terminals to a logic level corresponding to the input data in response to the first driving control signals and the second driving control signals.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Hereafter, a specific embodiment of a data output circuit of a semiconductor integrated circuit in accordance with the present invention will be described with reference to the accompanying drawings.

Figure 1:
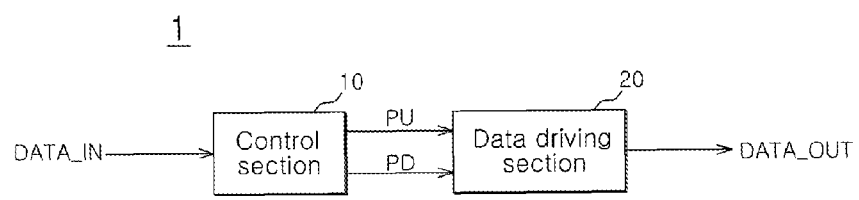
FIG. 1 is a schematic block diagram of a conventional data output circuit.
Figure 2:
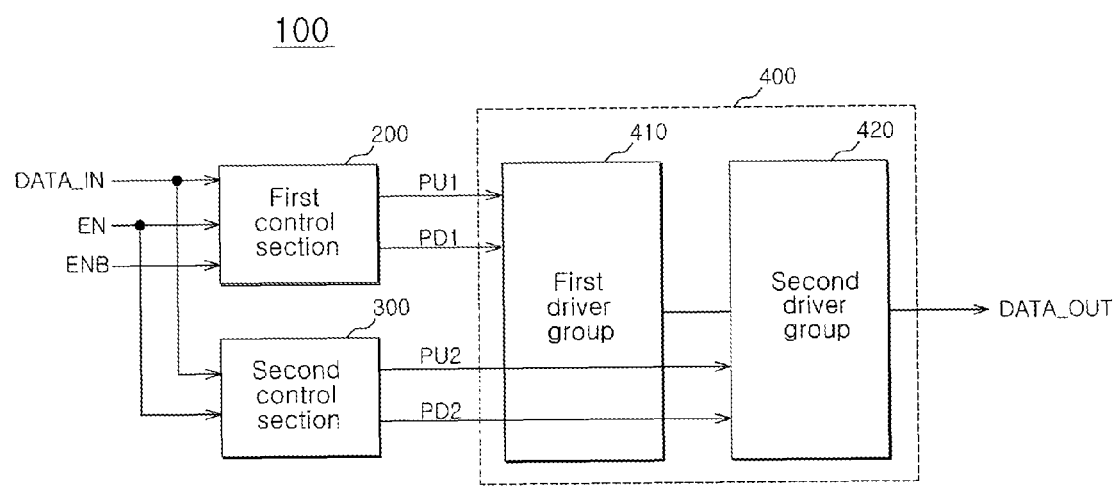
FIG. 2 is a schematic block diagram of an exemplary data output circuit of a semiconductor integrated circuit according to one embodiment.

FIG. 2 is a schematic block diagram of an exemplary data output circuit of a semiconductor integrated circuit according to one embodiment. In FIG. 2, a data output circuit 100 can be configured to include a first control section 200, a second control section 300, and a data driving section 400.

The first control section 200 can be configured to generate first driving signals 'PU1' and 'PD1' in accordance with the level of input data 'DATA_IN' irrespective of the level of a supply voltage 'VDDQ' when first enable signals 'EN' and 'ENB' are activated. The first enable signals 'EN' and 'ENB' can be signals for determining whether the data output circuit will operate or not. When the first enable signals 'EN' and 'ENB' have inactivation levels, the operation of the data output circuit can be interrupted irrespective of the input data 'DATA_IN'. When the first enable signals 'EN' and 'ENB' are inactivated, the first enable signal 'EN' can have a low level and the first enable signal 'ENB' can have a high level.

The second control section 300 can be configured to generate second driving signals 'PU2' and 'PD2' in accordance with the level of the input data 'DATA_IN' when the supply voltage 'VDDQ' drops below a preset level with the first enable signal 'EN' activated.

The data driving section 400 can include a first driver group 410 and a second driver group 420. The data output terminals of the first driver group 410 and the second driver group 420 can be commonly connected with each other.

The first driver group 410 can be configured to drive the data output terminals to the logic level of the input data 'DATA_IN' in response to the first driving signals 'PU1' and 'PD1'.

The second driver group 420 can be configured to drive the data output terminals to the logic level of the input data 'DATA_IN' in response to the second driving signals 'PU2' and 'PD2'.

Figure 3:
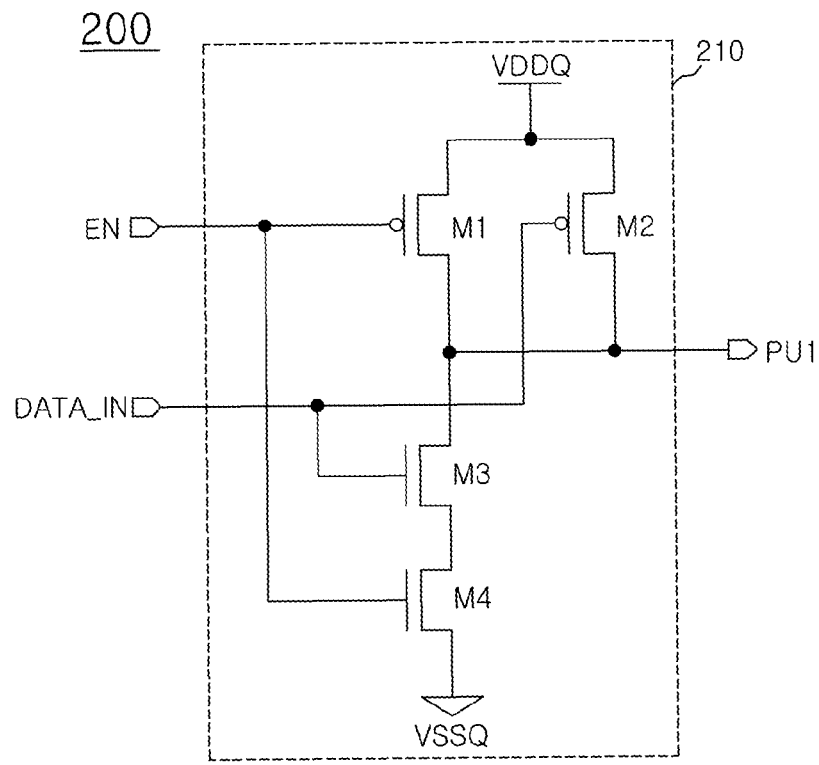
FIG. 3 is a schematic circuit diagram of an exemplary first control section capable of being implemented in the circuit of FIG. 2 according to one embodiment.
Figure 3:
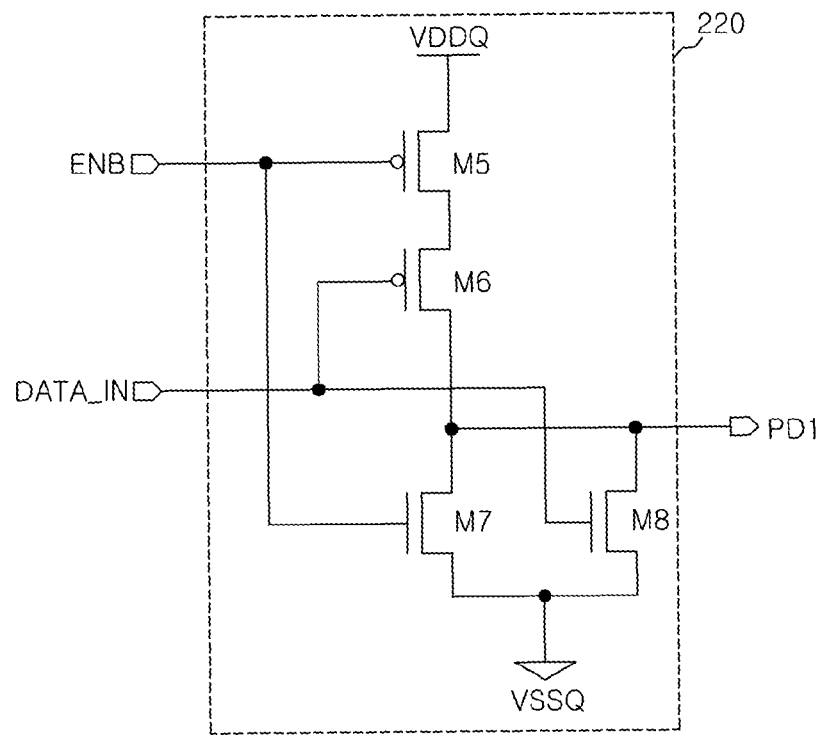

FIG. 3 is a schematic circuit diagram of an exemplary first control section capable of being implemented in the circuit of FIG. 2 according to one embodiment. In FIG. 3, the first control section 200 can include a first logic circuit unit 210 and a second logic circuit unit 220.

The first logic circuit unit 210 can include a plurality of transistors M1 through M4. Accordingly, the first logic circuit unit 210 can be configured to generate the first driving signal 'PU1' using the input data 'DATA_IN' when the first enable signal 'EN' is activated. When the first enable signal 'EN' is activated to a high level, the first logic circuit unit 210 can generate the first driving signal 'PU1' having a logic opposite to that of the input data 'DATA_IN'. When the first enable signal 'EN' is inactivated to the low level, the first logic circuit unit 210 can generate the first driving signal 'PU1' of a high level irrespective of the input data 'DATA_IN'.

The second logic circuit unit 220 can include a plurality of transistors M5 through M8. Accordingly, the second logic circuit unit 220 can be configured to generate the first driving signal 'PD1' using the input data 'DATA_IN' when the first enable signal 'ENB' is activated. When the first enable signal 'ENB' is activated to a low level, the second logic circuit unit 220 can generate the first driving signal 'PD1' having a logic opposite to that of the input data 'DATA_IN'. When the first enable signal 'ENB' is inactivated to the high level, the second logic circuit unit 220 can generate the first driving signal 'PD1' of a low level irrespective of the input data 'DATA_IN'.

Figure 4:
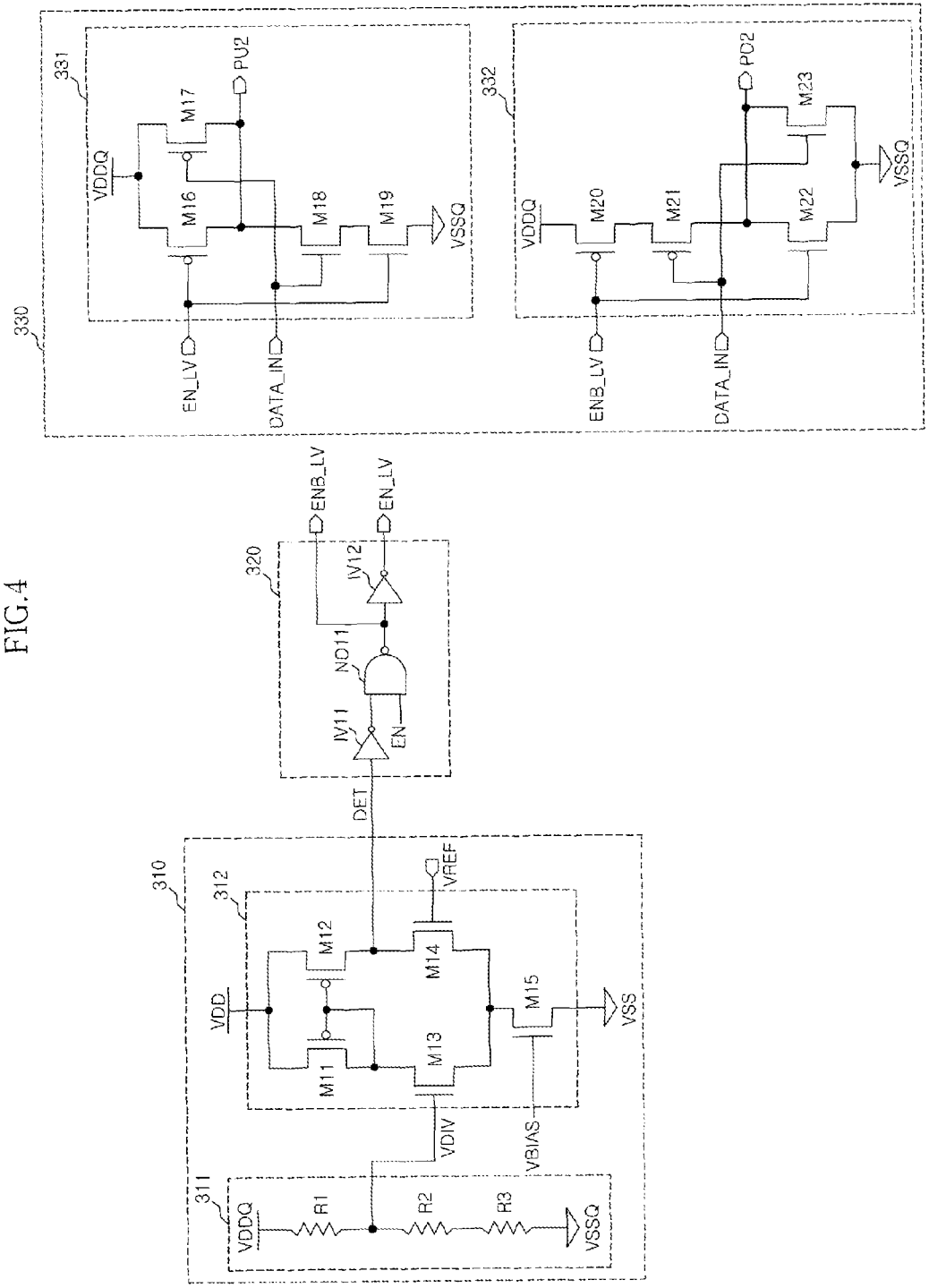
FIG. 4 is a schematic circuit diagram of an exemplary second control section capable of being implemented in the circuit of FIG. 2 according to one embodiment.

FIG. 4 is a schematic circuit diagram of an exemplary second control section capable of being implemented in the circuit of FIG. 2 according to one embodiment. In FIG. 4, the second control section 300 can be configured to include a voltage detection unit 310, a second enable signal generation unit 320, and a driving control signal generation unit 330.

The voltage detection unit 310 can include a voltage distributor 311 and a comparator 312. For example, the voltage distributor 311 can include a plurality of resistors R1 through R3 that can be interconnected between a supply voltage (VDDQ) terminal and a ground voltage (VSSQ) terminal. Here, the voltage distributor 311 can divide the supply voltage 'VDDQ' according to preset resistance ratios by the plurality of resistors R1 through R3, and can output a distribution voltage 'VDIV'. When the plurality of resistors R1 through R3 have substantially the same resistance, the distribution voltage 'VDIV' can have a level corresponding to ⅔ of the supply voltage 'VDDQ'.

The comparator 312 can include a differential amplifier having a plurality of transistors M11 through M15. Here, the comparator 312 can amplify differences between the distribution voltage 'VDIV' and a reference voltage 'VREF', and can output a voltage detection signal 'DET'.

Presuming that the plurality of resistors R1 through R3 can have substantially the same resistance value, if the supply voltage 'VDDQ' is about 1.8V, then the distribution voltage 'VDIV' can be about 1.2V. Similarly, if the supply voltage 'VDDQ' is about 1.2V, then the distribution voltage 'VDIV' can be about 0.8V. Accordingly, by setting the reference voltage 'VREF' to within a range of about 0.8V to about 1.2V, it is possible to determine whether the level of the currently applied supply voltage 'VDDQ' is about 1.8V or about 1.2V, based on the logic level of the voltage detection signal 'DET'.

When the distribution voltage 'VDIV' is higher than the reference voltage 'VREF', the comparator 312 can output the voltage detection signal 'DET' at a high level. Conversely, when the distribution voltage 'VDIV' is lower than the reference voltage 'VREF', the comparator 312 can output the voltage detection signal 'DET' at a low level.

The second enable signal generation unit 320 can include first and second inverters IV11 and IV12 and a NAND gate ND11. Here, the second enable signal generation unit 320 can be configured to combine the voltage detection signal 'DET' and the first enable signal 'EN', and can generate second enable signals 'EN_LV' and 'ENB_LV'. For example, the second enable signal generation unit 320 can be configured to generate the second enable signals 'EN_LV' and 'ENB_LV' using the voltage detection signal 'DET' when the first enable signal 'EN' is activated.

The driving control signal generation unit 330 can be configured to include a third logic circuit unit 331 and a fourth logic circuit unit 332. The third logic circuit unit 331 can include a plurality of transistors M16 through M19. Here, the third logic circuit unit 331 can be configured to generate the second driving signal 'PU2' using the input data 'DATA_IN' when the second enable signal 'EN_LV' is activated. When the second enable signal 'EN_LV' is activated to a high level, the third logic circuit unit 331 can generate the second driving signal 'PU2' having a logic opposite to that of the input data 'DATA_IN'. Conversely, when the second enable signal 'EN_LV' is inactivated to a low level, the third logic circuit unit 331 can generate the second driving signal 'PU2' of a high level irrespective of the input data 'DATA_IN'.

The fourth logic circuit unit 332 can include a plurality of transistors M20 through M23. Here, the fourth logic circuit unit 332 can be configured to generate the second driving signal 'PD2' using the input data 'DATA_IN' when the second enable signal 'ENB_LV' is activated. When the second enable signal 'ENB_LV' is activated to a low level, the fourth logic circuit unit 332 can generate the second driving signal 'PD2' having a logic opposite to that of the input data 'DATA_IN'. Conversely, when the second enable signal 'ENB_LV' is inactivated to a high level, the fourth logic circuit unit 332 can generate the second driving signal 'PD2' of a low level irrespective of the input data 'DATA_IN'.

Figure 5:
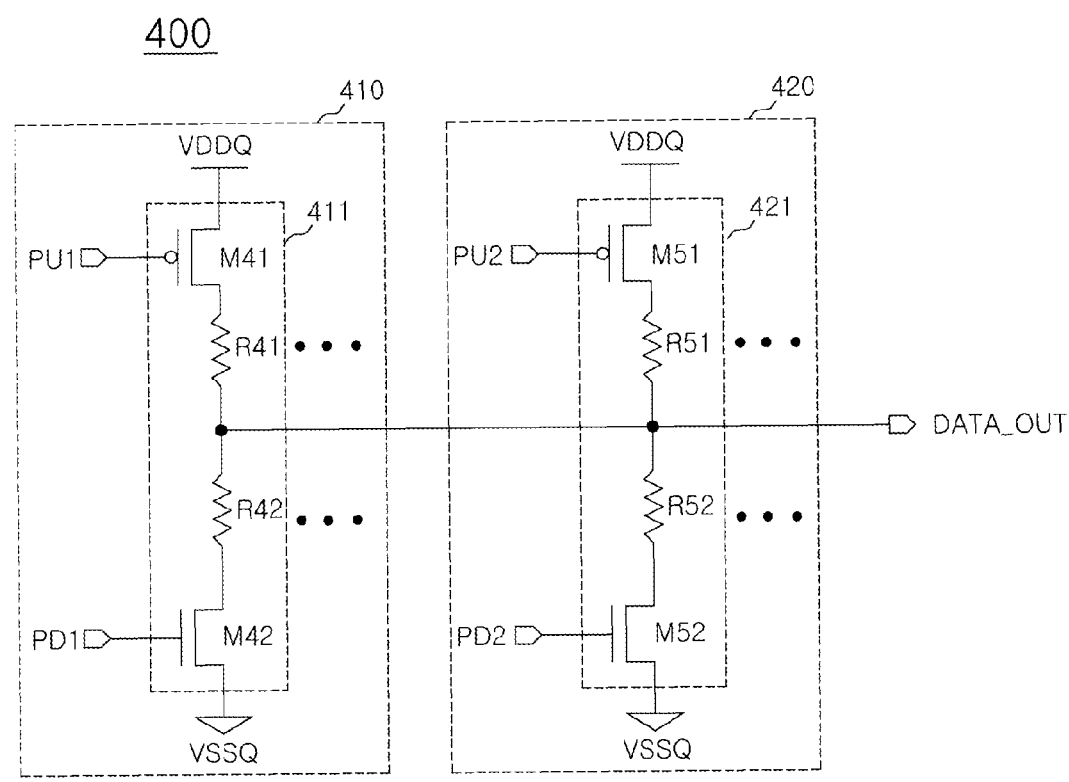
FIG. 5 is a schematic circuit diagram of an exemplary data driving section capable of being implemented in the circuit of FIG. 2 according to one embodiment.

FIG. 5 is a schematic circuit diagram of an exemplary data driving section capable of being implemented in the circuit of FIG. 2 according to one embodiment. In FIG. 5, a data driving section 400 can be configured to include the first driver group 410 and the second driver group 420. Here, the data output terminals of the first driver group 410 and the second driver group 420 can be commonly connected with each other.

The first driver group 410 can have a plurality of drivers 411, wherein each driver 411 can include a plurality of transistors M41 and M42 and a plurality of resistors R41 and R42. Any one of the plurality of transistors M41 and M42 can operates in response to the first driving signals 'PU1' and 'PD1', and can drive the data output terminal to a logic level corresponding to that of the input data 'DATA_IN'.

The second driver group 420 can include a plurality of drivers 421, wherein each driver 421 can include a plurality of transistors M51 and M52 and a plurality of resistors R51 and R52. Any one of the plurality of transistors M51 and M52 can operate in response to the second driving signals 'PU2' and 'PD2', and can drive the data output terminal to a logic level corresponding to that of the input data 'DATA_IN'.

An exemplary operation of a data output circuit will be described with reference to FIGS. 2-5. For purposes of explanation, the data output circuit can be configured to be commonly used with supply voltages 'VDDQ' of about 1.8V and about 1.2V.

A first situation in which the first enable signals 'EN' and 'ENB' are activated, and a supply voltage 'VDDQ' of 1.8V is supplied, will be described.

Since the first enable signals 'EN' and 'ENB' are output at a high level and a low level, respectively, the first control section 200 (in FIG. 3) can generate the first driving control signals 'PU1' and 'PD1' in accordance with the level of the input data 'DATA_IN'. Accordingly, when the input data 'DATA_IN' has a high level, the first control section 200 can output both the first driving control signals 'PU1' and 'PD1' at a low level. Conversely, when the input data 'DATA_IN' has a low level, the first control section 200 can output both the first driving control signals 'PU1' and 'PD1' at a high level. Since both the first driving control signals 'PU1' and 'PD1' can have the low level or the high level, all the drivers 411 of the first driver group 410 (in FIG. 5) can drive the data output terminals to the same logic level as the logic level of the input data 'DATA_IN', that is, a high level or a low level.

The voltage detection unit 310 of the second control section 300 (in FIG. 4) can output the voltage detection signal 'DET' at a high level since the distribution voltage 'VDIV' is higher than the reference voltage 'VREF'. Since the voltage detection signal 'DET' has the high level, the second enable signals 'EN_LV' and 'ENB_LV' can be output at a low level and a high level, respectively.

The driving control signal generation unit 330 (in FIG. 4) can output the second driving control signals 'PU2' and 'PD2' at a high level and a low level, respectively, since the second enable signals 'EN_LV' and 'ENB_LV' can have the low level and the high level, respectively. Since the second driving control signals 'PU2' and 'PD2' have the high level and the low level, respectively, all the drivers 421 of the second driver group 420 (in FIG. 5) can be interrupted in their operations.

A second situation in which the first enable signals 'EN' and 'ENB' are activated, and a supply voltage 'VDDQ' of about 1.2V is supplied, will be described.

Since the first enable signals 'EN' and 'ENB' can be output at a high level and a low level, respectively, the first control section 200 (in FIG. 3) can generate the first driving control signals 'PU1' and 'PD1' in accordance with the level of the input data 'DATA_IN'. When the input data 'DATA_IN' has a high level, the first control section 200 can output both the first driving control signals 'PU1' and 'PD1' at a low level. Conversely, when the input data 'DATA_IN' has a low level, the first control section 200 can output both the first driving control signals 'PU1' and 'PD1' at a high level. Since both the first driving control signals 'PU1' and 'PD1' can have the low level or the high level, all the drivers 411 of the first driver group 410 (in FIG. 5) can drive the data output terminals to the same logic level as the logic level of the input data 'DATA_IN', i.e., a high level or a low level.

The voltage detection unit 310 of the second control section 300 (in FIG. 4) can output the voltage detection signal 'DET' at a low level since the distribution voltage 'VDIV' can be lower than the reference voltage 'VREF'.

The second enable signal generation unit 320 can output the second enable signals 'EN_LV' and 'ENB_LV' at a high level and a low level, respectively, since the voltage detection signal 'DET' can have the low level. Since the second enable signals 'EN_LV' and 'ENB_LV' can have the high level and the low level, respectively, the driving control signal generation unit 330 (in FIG. 4) can generate the second driving control signals 'PU2' and 'PD2' in accordance with the logic level of the input data 'DATA_IN'.

When the input data 'DATA_IN' has a high level, the driving control signal generation unit 330 can output both the second driving control signals 'PU2' and 'PD2' at a low level. Conversely, when the input data 'DATA_IN' has a low level, the driving control signal generation unit 330 can output both the second driving control signals 'PU2' and 'PD2' at a high level. Since both the second driving control signals 'PU2' and 'PD2' have the low level or the high level, all the drivers 421 of the second driver group 420 (in FIG. 5) can drive data output terminals to the same logic level as the logic level of the input data 'DATA_IN', i.e., a high level or a low level.

In addition, when the first enable signals 'EN' and 'ENB' are inactivated to the low level and the high level, respectively, the first control section 200 (in FIG. 3) and the second control section 300 (in FIG. 4) can output the first driving control signals 'PU1' and 'PD1' at the high level and the second driving control signals 'PU2' and 'PD2' at the low level. Since the first driving control signals 'PU1' and 'PD1' have the high level and the second driving control signals 'PU2' and 'PD2' have the low level, the operations of the first driver group 410 and the second driver group 420 (in FIG. 5) can be interrupted.

As described above, when a supply voltage 'VDDQ' of about 1.8V is supplied between the first driver group 410 and the second driver group 420 (in FIG. 5), only the first driver group 410 can operate to conduct a data driving task. When 1.2V a supply voltage 'VDDQ' of about 1.2V is supplied, both the first driver group 410 and the second driver group 420 (in FIG. 5) can operate to conduct data driving tasks. Here, the detection of the supply voltage of about 1.2V and the control operation for the second driver group 420 can be automatically implemented by the second control section 300. As a result, when a supply voltage 'VDDQ' of about 1.2V is supplied, by increasing the number of drivers used for driving data, output impedance can be maintained at a value satisfying the standards even though a change occurs in the supply voltage 'VDDQ'.

In addition, the first and second driver groups 410 and 420 (in FIG. 5) can be used for generating both supply voltages 'VDDQ' of about 1.2V and 1.8V, without increasing a circuit area for the output circuit. Furthermore, output impedance can be maintained to a value satisfying standards even when supply voltages having different levels are used.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A data output circuit of a semiconductor integrated circuit, comprising:

a plurality of drivers configured to drive data output terminals to a logic level corresponding to levels of input data in response to driving control signals; and a control section configured to activate and output the driving control signals supplied to a first group of the plurality of drivers, and to activate or inactivate and output the driving control signals supplied to a second group of the plurality of drivers, depending upon a level of a supply voltage, wherein the control section comprises:

a first control section configured to activate the driving control signals supplied to the first group of the plurality of drivers when first enable signals are activated; and a second control section configured to activate the driving control signals supplied to the second group of the plurality of drivers when the first enable signals are activated and the level of the supply voltage is lower than the preset voltage level, and wherein the second control section comprises:

a voltage detection unit configured to activate a voltage detection signal when the level of the supply voltage is lower than the preset voltage level;

a second enable signal generation unit configured to activate second enable signals when the first enable signals and the voltage detection signal are activated; and a driving control signal generation unit configured to activate the driving control signals supplied to the second group of the plurality of drivers when the second enable signals are activated.

2. The data output circuit according to claim 1, wherein the voltage detection unit comprises:

a voltage distributor configured to divide the supply voltage according to preset resistance ratios and output a distribution voltage; and a comparator configured to compare the distribution voltage with a reference voltage and output the voltage detection signal.

3. The data output circuit according to claim 1, wherein the second enable signal generation unit is configured to logically AND the first enable signal and an inverted voltage detection signal, and to generate the second enable signals.

4. A data output circuit of a semiconductor integrated circuit, comprising:

a first control section configured to generate first driving control signals corresponding to input data;

a second control section configured to inactivate second driving control signals when a supply voltage has a first level, and to activate the second driving control signals to a level corresponding to the input data when the supply voltage has a second level;

a first driver group configured to drive data output terminals to a logic level corresponding to the input data in response to the first driving control signals; and a second driver group configured to drive the data output terminals to a logic level corresponding to the input data in response to the second driving control signals, wherein the second control section comprises:

a voltage detection unit for comparing a distribution voltage obtained by dividing the supply voltage according to preset resistance ratios with a reference voltage, and for producing a voltage detection signal; and a driving control signal generation unit for generating the second driving control signals in response to the voltage detection signal.

5. The data output circuit according to claim 4, wherein the driving control signal generation unit is configured to activate the second driving control signals to the logic level corresponding to the input data when the voltage detection signal having a logic level indicating that the distribution voltage is lower than the reference voltage is output.

* * * * *